June 8, 1937. Re 20,400
H. M. LEWIS
SHORT WAVE CONVERTER
Original Filed Sept. 25, 1931 3 Sheets-Sheet 1
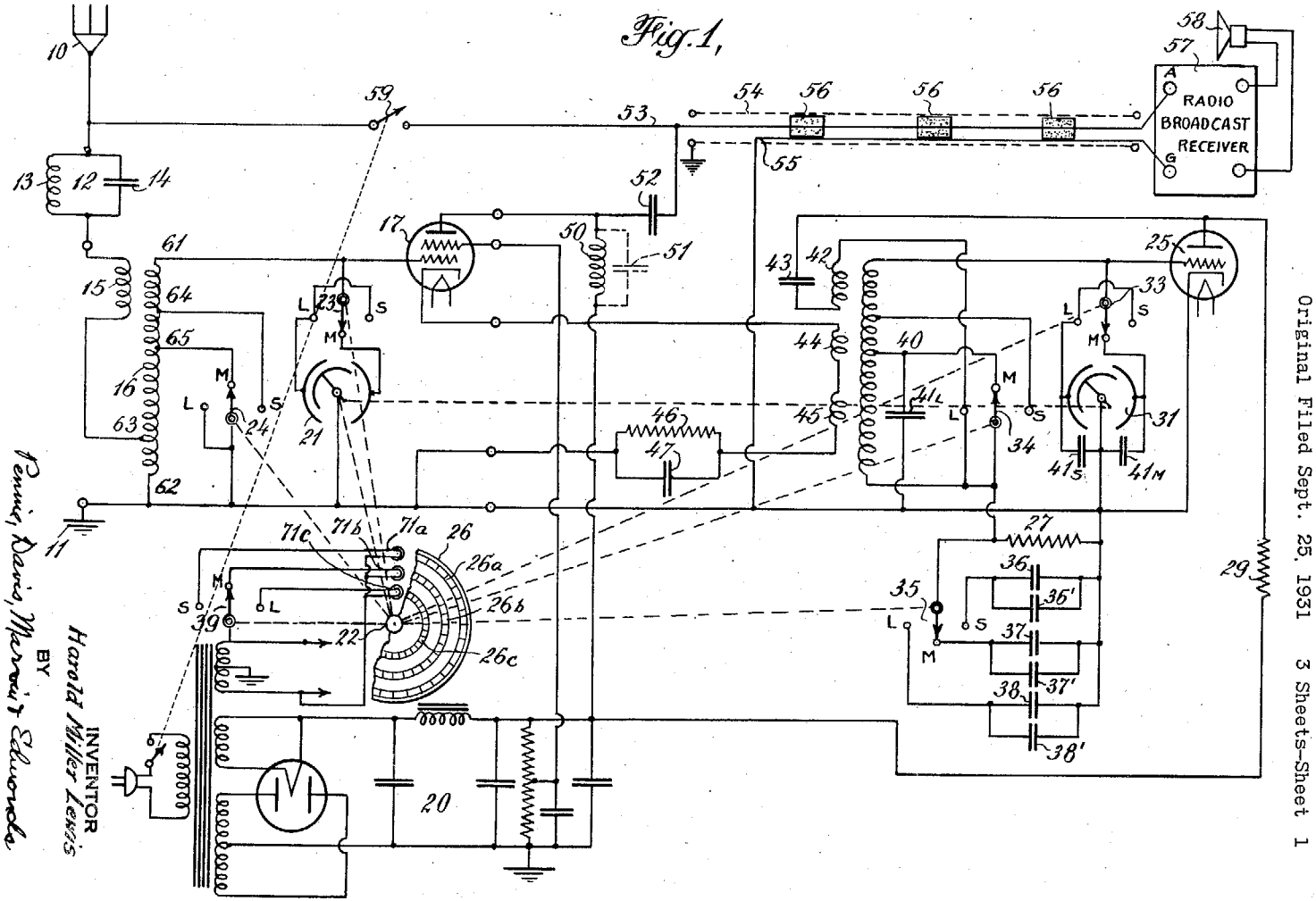
INVENTOR
Harold Miller Lewis
BY
Pennie, Davis, Marvin & Edwards
ATTORNEYS June 8, 1937.
Re 20,400
H. M. LEWIS
SHORT WAVE CONVERTER
Original Filed Sept. 25, 1931 3 Sheets-Sheet 2
Fig. 2,
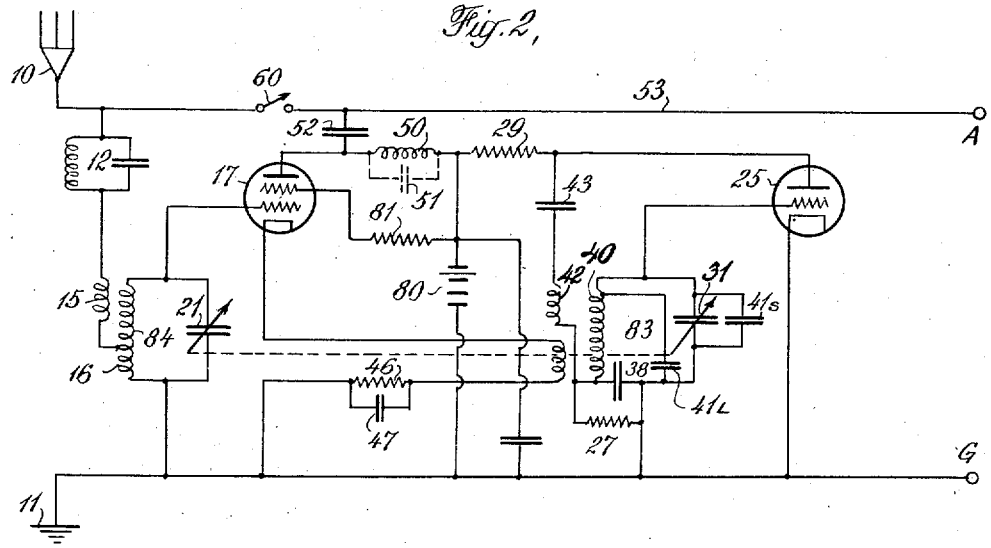
Fig. 3,
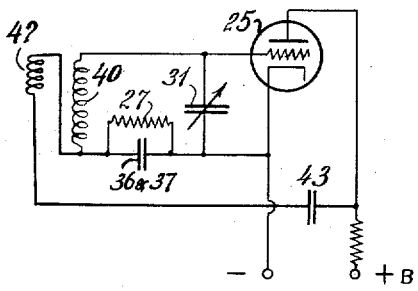
Fig. 4,
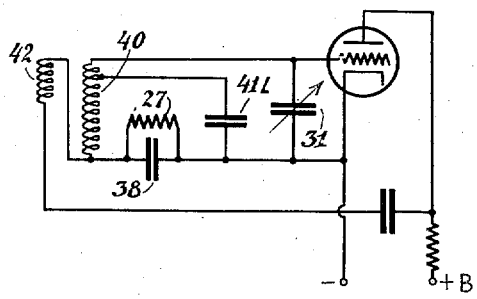
Fig. 5,
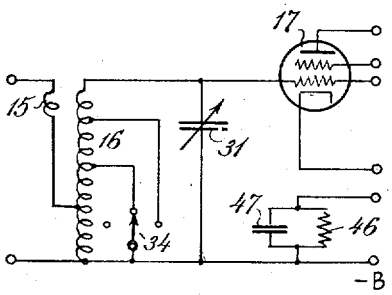
Fig. 6,
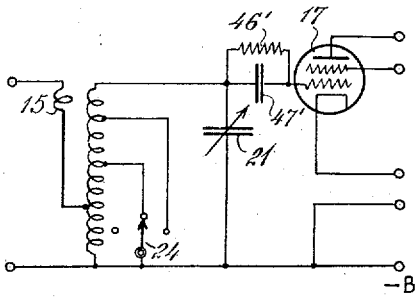
INVENTOR
Harold Miller Lewis
BY
Pennie, Davis, Marvin and Edmonds
ATTORNEYS June 8, 1937. Re 20,400
H. M. LEWIS
SHORT WAVE CONVERTER
Original Filed Sept. 25, 1931 3 Sheets-Sheet 3
Fig. 7,
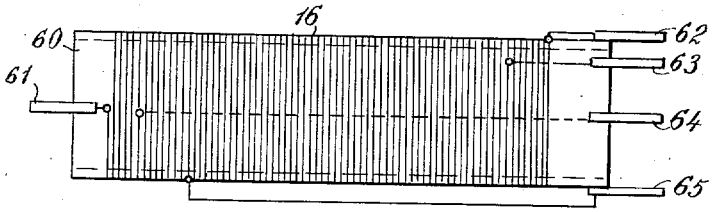
Fig. 8
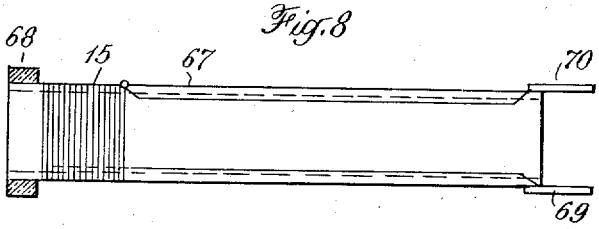
Fig. 9,
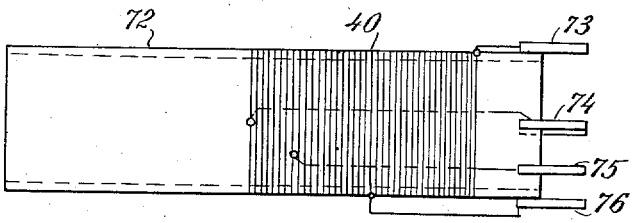
Fig. 10.
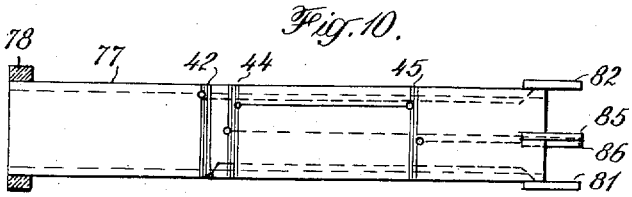
INVENTOR
Harold Miller Lewis
BY
Pennie, Davis, Marvin and Edmonds.
ATTORNEYS Reissued June 8, 1937

Re. 20,400

UNITED STATES PATENT OFFICE 20,400

SHORT WAVE CONVERTER

Harold Miller Lewis, Great Neck, N. Y., assignor to Hazeltine Corporation

Original No. 2,001,277, dated May 14, 1935, Serial No. 565,024, September 25, 1931. Application for reissue April 2, 1937, Serial No. 134,580

25 Claims. (Cl. 250—36)

The present invention relates to a tuning system, or, more particularly, to such a system for use in a short wave receiving apparatus. Exemplary of such a system is that used in a short wave converter.

A short wave converter is an apparatus which, when used in conjunction with any broadcast receiver, permits the reception of short wave signals by the said broadcast receiver. The converter comprises an oscillator and modulator, by which the short wave signal currents are converted into currents of a frequency within the tuning range of the broadcast receiver. The current of this frequency, which frequency will be referred to hereinafter as the "intermediate frequency", is amplified, detected and reproduced by the broadcast receiver.

The frequency range covered by the short wave band is approximately from 1500 kc. (200 meters) to 20,000 kc. (15 meters). This range of frequencies is so great that it is not practical to tune a circuit through the entire range by the variation of a single tuning element. Some arrangement must be provided for changing both of the frequency determining elements; that is, both the inductance and the capacity. In accordance with the usual practice the tuning is actually done by varying the capacity of a variable condenser, and the inductance is changed in steps to permit the condenser to tune the circuit throughout the various portions of the range.

It is common practice to divide the short wave band into several bands which will be referred to in this application as the "short wave band", the "middle wave band", and the "long wave band".

The inductances used in tuning the radio frequency circuits of the short wave receiver, or the radio frequency circuit and oscillator circuits of a converter, are usually wound on removable forms commonly known as "plug-in" coils, which coils are changed when desiring to go from one of the short wave bands to another. A system of this type has the disadvantages that it is expensive to manufacture and requires shifting of coils when operating.

Various systems have been proposed by which the inductance of the tuning coils is changed in steps by means of switches. However, the leads and switch mechanisms introduce capacities which considerably lessen the range of the tuning condensers, and usually the resulting large number of points to be switched has condemned this system. Furthermore, when the inductance of the tuning coil is changed in steps by means of switches, the tuning condenser is no longer effective to tune the circuit in correspondence with other tuned circuits of the receiver which are controlled by the same control means.

Furthermore, considerable difficulty is experienced in constructing an oscillator capable of covering such a broad range of frequencies, as there is a considerable difference in the feed-back coupling needed at the two ends of the short wave band.

It is the object of the present invention to overcome the above noted difficulties and provide a system in which the inductance values may be varied in steps by providing a system in which the leads required for changing the inductances are relatively short and have negligible capacity effects. It is a further object of this invention to provide an oscillator coupling system having a simple structure, not involving the use of moving parts, by which the coupling effect may be simultaneously altered as the frequency determining inductance is changed, to permit the oscillator to oscillate effectively throughout the entire short wave band.

It is a further object of the invention to provide an oscillator coupling system in which the inductance of the frequency-changing circuit is changed in steps to effect large changes in the oscillation frequency and in which a means is provided for simultaneously varying the tuning characteristic of the circuit to correspond with the tuning characteristic of the other tuned circuits of a receiver.

These and further objects of this invention will become apparent from the following specification taken in connection with the appended claims and drawings.

In one embodiment of the present invention the inductance of the frequency determining circuit of the converter oscillator is provided with a switch for short-circuiting the long wave portions thereof and long wave and middle wave portions thereof, when operating the oscillator to receive signals in the middle wave band and short wave band, respectively. Dual magnetic and capacitative feed-back couplings are provided between the plate circuit of the oscillator and the grid coil when operating within the middle wave band. When operating in the long wave band the inductive coupling is negligible, and the feed-back is essentially through the capacitative coupling between the plate and grid circuits. When operating in the short wave band the capacitative coupling effect becomes negligible, whereas the coupling between the circuits due to the inductive coupling, is considerable.

Provision is also made for obtaining a uniform coupling between the antenna circuit and the input of the modulator. A straight inductive coupling is utilized when receiving signals within the short wave and middle wave band. When operating in the long wave band an auto transformer effect is obtained by connecting the antenna circuit to include a portion of the long wave section of the grid inductance.

The modulator and oscillator windings are so arranged relative to the switches for short-circuiting their unused portions and relative to the grids of the modulator and oscillator tubes that the leads, particularly when the converter is operating in the short wave band, are as short as possible.

In order to permit the continuous rotation of the tuning dial in either direction to progressively tune the converter through the entire band, the condensers used in both the modulator input and oscillator circuits are each provided with double stators and double rotors so constructed that when the capacity between one of the pair of rotors and stators is maximum, that between the other pair of rotors and stators is minimum.

Switching means are provided, operated simultaneously with the switches for short-circuiting the unused portions of the tuning inductances, for connecting the appropriate sections of the condensers.

Series condensers are provided for connection in the oscillation circuit for each of the bands and are appropriately connected in circuit by a switch operated together with the previously mentioned switches, when the range of the converter is shifted from one band to the other. The padding condensers for the section of the oscillator tuning condenser, which is used for the middle wave band, is provided in shunt with this section. A condenser is connected from the middle wave band tap of the inductance to the stator of the condenser, so that when the entire tuning inductance is in use this condenser may act as a padding condenser for the long wave band. This condenser is then essentially in shunt with the section of the variable condenser in use. When the long wave section of the inductance is short-circuited, however, as when operating in the middle wave band, this condenser is in parallel with the series condenser in use at that time.

The condenser shaft has an indicator dial geared thereto so arranged that it rotates a complete revolution for each half revolution of the condenser shaft. This dial has thereon three indicating scales, the outer scale being for indicating the frequencies in the short wave band, and the inner scale being for indicating the frequencies in the long wave band. The scales pass by indicator lights placed behind the dial within a compartment which permits illumination of but a single scale by each lamp, and a switch operated simultaneously with the wave changing switches operates to light the appropriate scale. A full description of this feature of the present invention is given in an application of Harold Miller Lewis for "Tuning scale", Serial No. 565,027, filed September 25, 1931, Patent No. 1,987,857 dated January 15, 1935.

In order to permit the operation of a single control knob to control the frequency of reception, regardless of which of the three bands the converter is operating in, there is provided a gang switch mechanism operated by the condenser control knob at the appropriate instant as the dial is rotated from one to the other of the frequency bands.

It can thus be seen that an arrangement has been provided by which the set can be tuned through the entire short wave band by the operation of a single control, and by which the frequency for which this apparatus is set to respond is automatically indicated at all times as the set is tuned.

In order to prevent the reception of broadcast signals by the receiver used in conjunction with the converter, the leads between the converter, as well as the converter itself, are completely shielded. The antenna input of the converter contains a trap circuit to prevent currents of undesired frequency being impressed upon the input of the modulator and amplified thereby. The plate supply of the modulator contains a tuned radio frequency choke which is tuned roughly to the intermediate frequency and thereby tends to bypass currents of frequencies differing greatly therefrom which have been received in the converter. The full details of this portion of the present invention are given in U. S. Patent No. 2,000,084, issued May 7, 1935, on an application of Harold Miller Lewis for "Short wave receiver arrangement", Serial No. 565,025, filed concurrently with the original application.

Attention is now invited to the accompanying drawings in which:

Fig. 1 is a circuit diagram of the converter embodying the present invention;

Fig. 2 is a simplified circuit diagram of the converter circuit as connected when the switch is in the long wave position;

Figs. 3 and 4 are elementary diagrams for use in explaining the operation of the oscillator circuit;

Fig. 5 is a simplified diagram of the modulator circuit;

Fig. 6 is a diagram of an alternative modulator circuit;

Figs. 7 and 8 represent the secondary and primary windings respectively of the antenna coupling transformer used in the converter comprising the present invention, and Figs. 9 and 10 represent the secondary and primary respectively of the oscillator coil.

Referring now to Fig. 1, the antenna circuit includes the antenna 10, the ground 11, the trap circuit 12, comprising the inductance 13 and condenser 14, the primary winding 15, and a portion of the secondary winding 16. The inductance 13 and the condenser 14 of the trap circuit 12 are so proportioned that said circuit is resonant to the intermediate frequency produced by the short wave converter. The input circuit of the converter is connected to the grid of modulator device 17, which may be any thermionic tube, though that shown is of the screen grid type. The input circuit is tuned by means of the condenser 21, which may be a double condenser employing, as shown, a single rotor and two stators so arranged that the capacity obtained between the rotor and one stator is maximum, when the capacity between the rotor and the other stator is minimum. The connections to the stators are controled by means of the switch 23. The actual condenser includes two stators and two rotors, so arranged that when one rotor is entirely within its stator, the other rotor is entirely out of its stator. The function of the condenser and switch arrangement will be explained later.

The tapped secondary 16 is connected by means of switch 24, so that any of the tapped portions of the secondary may be included in the input circuit. The switch is so connected that the unused portions of the winding are short-circuited.

For producing the heterodyne frequency for combining with the incoming signal and thus producing the intermediate frequency, there is provided the oscillator 25. This oscillator tube is of the single grid type and includes in its grid circuit the secondary 40 of the oscillation transformer, the primary 42 of which is connected in the plate circuit which includes stopping condenser 43. The secondary 40 is a tapped winding similar to 16 of the antenna transformer, and the connections to said secondary are controlled by means of switch 34. The grid return of the oscillation circuit is completed through the biasing resistor 27, which is connected to the cathode of the tube 25. The frequency of the oscillation circuit is determined by means of condenser 31, which is similar to condenser 21, and is connected to be operated therewith in a uni-control manner by means of the control knob 22 associated with the indicator dial 26.

The connections to the two continuously variable portions of the condenser 31 are controlled by means of switch 33.

Padding condensers 41M and 41S are provided across the two portions of condenser, as shown, for the purpose of aligning the oscillation circuit with the input of modulator 17 in the middle wave range and short wave range, respectively. Padding condenser 41L is connected across the long wave portion of the inductance winding 40, so that when the switch 34 is on contact L this condenser is practically in shunt with the condensers 31 and 41S for adjusting the alignment in the long wave range. When the switch 34 is on contact M, the condenser 41L is in shunt with condensers 37 and 37′, and the total series capacity is at that time the sum of these three condensers.

In series with condenser 31 is provided a series capacity which is variable in steps, comprising condensers 36, 37 and 38, the connections to which are controlled by means of the switch 35. Each of these condensers is provided with the padding condenser 36′, 37′, or 38′, respectively, for the purpose of correcting the alignment of oscillator circuit with the modulator input in the various frequency bands. In the middle frequency band, as has just been stated, the condenser 41L is in shunt with 37 and 37′. Coupling coils 44 and 45 coupled to the middle and long wave portions of the secondary 40, respectively, are included in the cathode circuit of the modulator 17. This circuit also includes the biasing resistor 46 shunted by by-pass condenser 47 for the purpose of causing tube 17 to act as a modulator.

The plate and screen grid potential are provided by means of the power supply source 20 which, as shown, is of the ordinary double wave rectifier and filter type. This power supply also provides heater lighting current for heating the cathodes of tubes 17 and 25. A resistor 29 is included in the plate lead of the oscillator 25 for the purpose of reducing the plate potential thereof.

As shown, the dial 26 includes three scales, 26—*a*, 26—*b*, and 26—*c*, these scales covering the short wave band, middle wave band, and long wave band, respectively.

It is to be noted that in order to get better spacing of the frequency indicators, the short wave scale is placed in the outer position on the dial 26, as the condenser motion to get the frequency separation required to separate the various stations is less in the short wave band than it is in the long wave band.

For the purpose of indicating in which of the frequency ranges the converter is operating, each of the scales is provided with one of the illuminating lights 71—*a*, 71—*b*, or 71—*c*, controlled by means of switch 39 to light them when tuning through the short wave band, middle wave band, and long wave band, respectively.

Switches 23, 24, 33, 34, 35 and 39 are so arranged as to be simultaneously operated and also to be actuated by the control knob 22 as the condensers are tuned through the limiting capacities for one of the frequency bands. Thus, the rotation of the control knob 22 results in the actuation of the switches 23 and 33, resulting in switching of the connections to condensers 21 and 31, respectively, to give the opposite capacity extreme for the modulator and oscillator circuits. Switch 39 is simultaneously operated changing the lighting of the indicating lights and thus indicating the change in the frequency band by changing the indication from one to another of the scales. The specific means for actuating the switches constitute no part of the present invention.

Included in the plate supply to the modulator 17 is the inductance 50. This inductance may have a high inherent capacity as indicated by capacity 51, or an actual condenser may be placed in shunt therewith. The inductance and capacity, however, are so proportioned that frequencies other than the desired intermediate frequency will be by-passed.

A connection from the output of modulator 17 is made through condenser 52 and lead 53 to the antenna binding post of the receiver 57. This connection is made through a shielded cable 54, which may, for example, be a BX cable, from the walls of which the lead 53 is spaced by means of bakelite spacers 56. Also connected through the cable 54 is the ground connection 55, which is connected to the ground binding post of receiver 57. The capacity 52 and the inherent capacity between the leads 53 and 55 are so proportioned that they constitute a dummy antenna to properly load the modulator 17, and to prevent misalignment of the input of receiver 57. Switch 59 is provided between the antenna 10 and the lead 53 by means of which the antenna may be directly connected to the input of the receiver 57 when it is desired to receive signals in the broadcast band directly on receiver 57.

The receiver 57 may be of any well known type, and is provided with the usual sound reproducing device 58. The specific details of neither 57 nor 58 constitute any part of the present invention.

The receiver is tuned to the intermediate frequency which it is desired to utilize, preferably 1,000 kc. The direct reception of signals of 1,000 kc. when the set is being operated to receive short wave signals by means of the converter, is prevented by means of the shielded cable 54. The modulator is prevented from acting as an amplifier of signals of 1,000 kc. frequency by means of trap circuit 12. Any signals of a frequency other than 1,000 kc. in the output of modulator 17 would be by-passed through the inductive 50. It is thus seen that a number of provisions have been made to prevent the interference of broadcast signals with the short wave signals being received by means of the converter.

In Fig. 2, to which attention is now invited, the circuit shown in Fig. 1 is again represented, except that the switches have been eliminated, the connections being made as if the converter were tuned to some frequency within the long wave band. In this circuit the high potential is represented as being supplied by means of the direct-current source 80, and the screen grid potential of the device 17 is obtained therefrom by including a resistor 81 in the screen grid circuit. The output of the oscillator circuit herein represented as 83 is fed to the cathode lead of the modulator 17 which, as has been described, is biased for grid bias detection. The incoming signal is fed through the oscillatory circuit 84 to the input of tube 17, which by means of the biasing resistor 46 operates as a rectifier or modulator, and thereby produces in its output circuit a distorted wave form from which a current of the intermediate frequency can be selected and supplied through the condenser 52 to the terminals A and G of the radio broadcast receiver.

It is to be noted that frequencies other than the intermediate frequency for which the radio broadcast receiver is to be adjusted are by-passed through the inductance 50, whereas this inductance and its inherent capacity form a high impedance path relative to currents of the intermediate frequency.

As previously stated, the circuit 12 acts to prevent currents of the intermediate frequency being received over the antenna 10 and amplified by the modulator 17, and the shielding of the lead 53 prevents a direct pick-up between the output of the device 17 and the input of the radio broadcast receiver.

The oscillator circuit 83 contains, as can be seen, the usual series condenser 38 in series with the tuning condenser 31, by means of which the circuit 83 is made to respond to a frequency continuously differing from the frequency to which circuit 84 responds by the amount of the intermediate frequency as the circuits are tuned in a uni-control manner.

Figs. 3 and 4 illustrate the means by which the single oscillation transformer is made to cover the considerable frequency range required of this type of equipment. The various portions of the inductance 40 are tuned by the respective parts of the condenser 31 and thus constitute a tuned grid circuit.

In order to provide the offset frequency and thus permit alignment between the condensers 31 and 21 to permit ganging, a series condenser 36, 37 or 38 is provided. This condenser has the dual function of assisting the alignment and of permitting capacitative feed-back action. The introduction of this capacity in the grid return requires a resistor 27 to prevent the grid from floating and to act as a grid bias resistor.

More specifically, Fig. 3 shows the action on the circuit when it is operating in the short wave and middle wave band. The used portion of the inductance 40 in these bands is relatively small and there is considerable coupling effect between the feed-back inductance 42 and inductance 40. This is particularly true in the short wave band.

In the short wave band the capacitative feed-back coupling is negligible. In the middle wave band, however, the capacitative feed-back action is considerable. The inductive feed-back action between 42 and 40 is less within this range, and the two couplings are so arranged as to give practically uniform operation throughout the middle frequency band.

Referring particularly to Fig. 4, in which the circuit represents the action of the oscillator circuit when operated in the long wave band, the inductive coupling between the coils 42 and 40 is negligible, and the oscillator is of the capacity coupled type utilizing the series capacity 38.

Fig. 4 also represents the padding capacity arrangement. As can be seen from Fig. 1, the same section of the condenser 31 is utilized throughout the long and short wave bands. This complicates the arrangement required for the padding capacity in these two bands. The usual padding condenser 41M, however, is provided for the middle frequency band. The usual padding condenser 41S is also shunted across the section of the condenser used for the long and short wave bands. This capacity is adjusted for the short wave bands, and it has been found that it should have a very low value. For padding the condenser 31 for operation in the long wave band, the condenser 41L is shunted across that portion of the coil which is in use only during operation in the long wave band. The few turns of winding 40, not shunted by this condenser, are negligible when operating within the long wave band, so that the condenser 41L is essentially in parallel with the condenser 31. However, as can be seen from Fig. 1, when the switch 34 is on contact M for operation in the middle frequency band, the condenser 41L is in parallel with the condensers 37 and 37′, the capacities of which are, therefore, adjusted to form the total series capacity which is required for producing alignment within the intermediate frequency band.

It can thus be seen that a substantially uniform feed-back coupling is obtained throughout all three of the wave bands.

An important feature of the present invention is that as there is but a single tuning stage in the input to the modulator device, the oscillator frequency is the principal determinate of the frequency to which the converter is set to respond. This, it can be seen, increases the tuning range of the converter somewhat beyond what would be the case if the condenser 21 determined the range. As an example, when using a 1,000 kc. intermediate frequency and tuning the oscillator between 3,000 and 9,000 kc., which is a 3:1 ratio, the incoming frequency which can be received will vary between 2,000 and 8,000 kc., giving a receiving frequency ratio of 4:1.

Fig. 5 shows the modulator of Figs. 1 and 2 arranged for comparison with the circuit shown in Fig. 6.

Fig. 6 shows an alternative form of modulator circuit in which the grid leak type of detection is used. This type of circuit gives slightly better sensitivity than that shown in Fig. 5, which latter is the usual grid bias arrangement and gives a better noise level but less sensitivity.

In Fig. 6 the low resistance grid biasing resistor 46 and its shunt condenser 47 have been removed, and the grid leak 46′ and grid leak condenser 47′ in the grid circuit of the tube 17 have been substituted therefor.

Although it is clear that the specific coils for use in a converter constructed in accordance with the present invention will depend upon the characteristics of various other elements and upon the frequency ranges to be considered, the inductances used in covering the frequency ranges from 1,740 kc. to 19,400 kc. are shown in Figs. 7–10, and will now be described.

Fig. 7 illustrates the antenna coupling secondary. This secondary is wound on a 1⅛ inch form 60 and comprises 69¾ turns of No. 18 B & S gauge enameled wire wound 20 turns per inch. The terminal 61 is connected to the grid of the tube 17 and the terminal 62 is connected to the ground 11. The tap 64 is taken to include 5½ turns and is connected to contact S of switch 24. The tap 65 is taken to include 20¼ turns and is connected to contact M of switch 24. The terminal 63 is connected to the antenna coil 15 and is taken 5⅛ turns from the terminal 62.

The primary of the antenna coupling transformer is wound on ¾ inch form 67 and is placed inside the form 60 of Fig. 7, and spaced therefrom by means of spacer 68. The winding 15 comprises 18 turns of No. 26 B & S gauge enameled wire wound 24 turns per inch. The terminals 69 and 70 are connected to the trap circuit 12 and terminal 63 of winding 16, respectively.

The oscillator secondary winding 40, shown in Fig. 9, comprises 43¾ turns of No. 18 B & S gauge enameled wire wound on 1¼ inch form 72, 20 turns per inch. The terminal 73 is connected to contact L of switch 34 and the contact 74 is connected to the grid of oscillator tube 25. The tap 75 is taken 5⅛ turns from the end of coil and the terminal 75 is connected to contact S of switch 34. The terminal 76 is tapped 15¼ turns from the end of the coil and is connected to contact M of switch 34.

The feed-back coupling coil 42 and the modulator coupling coils 44 and 45, shown in Fig. 10, are all wound on a ¾ inch form 77 which is placed inside of form 72 and spaced therefrom by means of spacer 78. The winding 42 comprises 4½ turns of 30 B & S gauge enameled wire close wound. Terminals 81 and 82 of winding 42 are connected to the contact L of switch 34 and the oscillator plate condenser 43, respectively. Windings 44 and 45 comprise 5 and 4½ turns, respectively, of No. 30 B & S gauge enameled wire close wound. Winding 45 is spaced ¼ inch from winding 42, and windings 44 and 45 are spaced approximately 2½ inches apart. These coils are connected in series and are connected by terminals 85 and 86 to the cathode of modulator 17 and the modulator bias resistor 46, respectively.

The condensers used have a maximum capacity of 195 microfarads and a minimum capacity of 19 microfarads.

Using the coils just described, the calibrated range of the converter is:

| | Kilocycles | Meters |
|---|---|---|
| Long wave band | 1740–4180 | (163–72) |
| Middle wave band | 3800–9075 | (79–33.1) |
| Short wave band | 8650–19400 | (34.8–15.5) |

Certain other constants which have been found satisfactory are included:

| | | | |
|---|---|---|---|
| Resistance | 27= | 250,000 | Ohms |
| Do. | 29= | 25,000 | do. |
| Do. | 46= | 3,000 | do. |
| Condenser | 36= | 450 | micromicrofarads |
| Do. | 37= | 1,500 | do. |
| Do. | 38= | 1,500 | do. |
| Do. | 43= | .1 | Microfarads |
| Do. | 47= | .1 | do. |

Although any appropriate tubes may be used a UY224 has been found appropriate for use as modulator 17 and UY227 has been found to be appropriate for use as the oscillator 25. The power supply device may be provided with the usual UX280, although it is to be understood that any appropriate power supply arrangement may be substituted for that shown.

What is claimed is:

1. In a vacuum tube oscillator for heterodyne reception covering a broad band of wavelengths, subdivided into a short wave band, a middle wave band, and a long wave band, a vacuum tube, a tunable grid circuit connected to the input of said vacuum tube, and comprising inductance, a variable condenser and a condenser variable in steps, a feedback path between the output of said tube and the tunable circuit, said path including a second inductance, inductively coupled to said tunable circuit, and said condenser variable in steps, and switching means for simultaneously changing the value of said first inductance and said condenser variable in steps whereby feedback is primarily accomplished by an electromagnetic coupling for the short wave band, by a combined electromagnetic and electrostatic coupling for the middle wave band, and by electrostatic coupling for the long wave band.

2. An oscillation generator for generating a current of any frequency in a plurality of wave bands, comprising a vacuum tube having plate, grid and cathode electrodes, a grid circuit for determining the frequency to be generated, connected between the grid and cathode, said circuit comprising an adjustable inductance in series with a capacity adjustable in steps, shunted by a continuously variable condenser, a control member for operating said variable condenser, a feed-back circuit between plate and cathode, having an inductance magnetically coupled with said first mentioned inductance, and including said adjustable capacity, and switching means, operated by said control member to simultaneously change the values of said adjustable inductance and said adjustable capacity.

3. In an oscillation generator of the thermionic vacuum tube type, a grid circuit, a frequency determining net work in said circuit, comprising a variable inductance, a capacity variable in steps, and a continuously variable capacity tuning said circuit, and a feed-back circuit, including an inductance magnetically coupled to the first mentioned inductance, and including said capacity variable in steps.

4. In a vacuum tube oscillator for heterodyne reception covering a broad band of wave lengths, an oscillator tube, grid and plate circuits for said tube inductively related to each other and including a common capacitive path, a condenser for tuning said grid circuit, and switching means for altering the effective inductance of said grid circuit and simultaneously altering the capacity of said common capacitive path as the wave length band to which said circuits are adapted to respond is altered.

5. An oscillation generator adapted to cover a broad range of frequencies comprising a vacuum tube having grid and plate circuits, said grid and plate circuits including inductance means and being inductively related to each other, capacitance means common to said grid and plate circuits, and means for selectively connecting predetermined portions of said inductance means and capacitance means in said grid and plate circuits to effect large changes in the oscillation frequency.

6. A system in accordance with claim 1, in which a plurality of variable condensers are provided for tuning the grid circuit of said oscillator, and selecting means operated simultaneously with said switching means to selectively connect one of said condensers in said grid circuit.

7. A system in accordance with claim 1, in which a plurality of variable condensers are provided for tuning the grid circuit of said oscillator, selecting means operated simultaneously with said switching means to selectively connect one of the said condensers in said grid circuit, and an adjustable padding condenser arranged in shunt with each of said tuning condensers.

8. In a heterodyne receiving system, an oscillator circuit adjustable to produce oscillations covering a broad wave length band subdivided into a short wave band, a middle wave band and a long wave band, said oscillator circuit comprising an oscillator tube, grid and plate circuits for said tube, said grid circuit comprising a tuned inductance having one end connected to the grid of said tube and having a middle wave length tap and a short wave length tap, a switch connected to selectively short-circuit the portions of said inductance below said taps to cause said inductance to respond to frequencies throughout the middle wave length band or the short wave length band respectively, a series alignment condenser for each of the wave length bands, each of said condensers having one side connected to the cathode of said oscillator tube, switching means for connecting the appropriate series alignment condenser in series in the grid circuit, said switching means being connected to and simultaneously operable with the first-mentioned switching means, a variable condenser connected between the grid and cathode of said tube to tune the grid circuit throughout the selected wave length band, a resistance shunted across the series alignment condenser connected in series in the grid circuit between said inductance and the cathode of said tube, and a condenser connected between the middle wave length tap of said inductance and the cathode side of said variable condenser, whereby it is alternatively placed substantially in shunt with said variable condenser and in shunt with the series alignment condenser used in the middle wave band, and said plate circuit including a stopping condenser, an inductance, and the series alignment condenser connected in the grid circuit by said switching means, said last-mentioned inductance being inductively coupled to the grid end of said tuning inductance and connected to the low potential end thereof, whereby the coupling of said circuits is altered as the frequency of the band is changed.

9. In a heterodyne receiving system, an oscillator circuit adjustable to produce oscillations covering a broad wave length band, said oscillator comprising a tube; grid and plate circuits for said tube; said grid circuit comprising in series a tuning inductance, a switch so connected as to short-circuit portions of said inductance to cause it to respond to frequencies throughout a plurality of wave length bands, an alignment condenser for each of the wave length bands, and switching means for connecting the appropriate alignment condenser in series in said grid circuit, said switching means being simultaneously operated with said switch, and a variable condenser connected between the grid and cathode of said tube; and said plate circuit including an inductance, inductively coupled to the grid end of said tuning inductance, and the alignment condenser connected in said grid circuit by said switching means, said inductances and said alignment condenser being so proportioned that the coupling between said circuits is essentially electromagnetic at the short wave length end of the band and essentially electrostatic at the long wave length end of the band.

10. An oscillator for covering a broad band of wave lengths, which comprises a vacuum tube, grid and plate circuits therefor, an inductive coupling between said circuits, means for altering the effective inductance of said grid circuit to make large changes in the frequency of said oscillator, a variable condenser in said grid circuit to vary its tuning, an auxiliary condenser and means related to said inductance altering means for alternatively connecting said auxiliary condenser in circuit as a coupling capacity between said plate and grid circuits or substantially in shunt with said variable condenser.

11. A heterodyne radio-frequency system for operation over a broad wave band, comprising an oscillator including grid and plate circuits, said circuits each including inductively coupled inductances, and said grid circuit including means for short-circuiting portions of the inductance included therein, one of a plurality of variable condensers, and one of a plurality of coupling condensers, all connected in series, a padding condenser in shunt with each of the variable condensers, means for selectively connecting one each of said plurality of variable condensers and of said plurality of coupling condensers in said grid circuit, an auxiliary condenser, and means for alternatively connecting said auxiliary condenser in parallel with the coupling condenser then connected in said grid circuit or substantially in shunt with the variable condenser at that time connected in the circuit.

12. In an oscillation generator of the thermionic vacuum tube type, a grid circuit, a plate circuit, a frequency-determining network in said grid circuit comprising an inductance, a first condenser variable in steps, and a second condenser which is continuously variable for tuning said grid circuit, means for short-circuiting a portion of said inductance for effecting large changes in the frequency of the current generated by said oscillation generator, feedback couplings between grid and plate of said generator and including said first condenser and an inductance electromagnetically coupled to said inductance in said grid circuit, the two couplings together thus provided between said plate and grid circuits being proportioned to provide a more uniform output over each of said frequency ranges than would either coupling taken alone.

13. In an oscillation generator including a thermionic vacuum tube, a grid circuit, a frequency-determining network in said grid circuit, said network including inductance variable in steps, a first condenser variable in steps, and a second condenser which is continuously variable for tuning said grid circuit, a feedback circuit including said first condenser and an inductance electromagnetically coupled to said first-named inductance, and means for simultaneously varying said first condenser and said first-named inductance in steps to effect large changes in the frequency of said oscillation generator.

14. In an oscillation generator including a thermionic vacuum tube, a grid circuit, a frequency-determining network in said grid circuit, said network including inductance variable in steps, a first condenser variable in steps, and a second condenser which is continuously variable for tuning said grid circuit, a feedback circuit including said first condenser and an inductance electromagnetically coupled to said first-named inductance, and means for simultaneously varying said first condenser and said first-named inductance in steps to effect large changes in the frequency of said oscillation generator, the step variations of said first condenser and of said inductance being so proportioned that said first condenser is more effective as a feedback coupling for the lower frequencies than as a feedback coupling for the higher frequencies.

15. An oscillation generator comprising a vacuum tube having a grid circuit, a frequency-determining network in said grid circuit, said network including inductance means adjustable in steps, capacitance means adjustable in steps and a continuously adjustable condenser for tuning said grid circuit, a feed-back circuit including inductance means electromagnetically coupled to said first-named inductance means, and means for adjusting said first-named inductance means in steps to effect large changes in the frequency of said oscillation generator and for simultaneously adjusting said capacitance means for adjusting the coupling between said feed-back circuit and said frequency-determining circuit.

16. In an oscillation generator including a thermionic vacuum tube, a grid circuit, a frequency-determining network in said grid circuit, said network including inductance variable in steps, a first condenser variable in steps, and a second condenser which is continuously variable for tuning said grid circuit, a feedback circuit including said first condenser and an inductance electromagnetically coupled to said first-named inductance, and means for simultaneously varying said first condenser and said first-named inductance in steps to effect large changes in the frequency of said oscillation generator, the step variations of said first condenser and of said inductance being proportioned to cause said first condenser to serve as the principal feedback coupling for the generation of the lower frequencies and to cause said inductance coupled to said first-named inductance to serve as the principal feedback coupling for the generation of the higher frequencies.

17. An oscillation generator comprising a vacuum tube having a grid circuit, a frequency-determining network in said grid circuit, said network including inductance means adjustable in steps, a continuously adjustable condenser for tuning said grid circuit, a feed-back circuit including inductance means electromagnetically coupled to said first-named inductance means, capacitance means in series with a plurality of said inductance steps, means for adjusting said first-named inductance means in steps to effect large changes in the frequency of said oscillation generator, and thereby simultaneously adjusting said capacitance means to adjust the coupling between said feedback circuit and said frequency-determining circuit.

18. In an oscillation generator of the vacuum tube type, adapted to generate oscillations throughout a wide band in frequency and including a tube having plate and grid circuits, a frequency determining circuit, included in the grid circuit of said tube and comprising an inductance, a first capacity and a second capacity, and a feedback circuit, coupled to the plate circuit of said tube and comprising said first capacity, means included in said frequency-determining circuit for continuously varying the generated frequency over a narrow band, and means for changing in steps the position of said narrow band within said wide band, said last-mentioned means comprising switching means for simultaneously changing in steps the inductance of said frequency-determining circuit and the first capacity included in both said feedback and said frequency-determining circuits.

19. An oscillation generator adapted to generate oscillations throughout a wide band of frequencies and including a vacuum tube having plate and grid circuits, a frequency-determining network included in the grid circuit of said tube and comprising inductance means, capacitance means and a variable condenser, a feedback circuit coupled to said plate circuit and said network, means comprising said condenser included in said network for continuously varying the generated frequency over a narrow band, and means for adjusting in steps the portion of said narrow band within said wide band, said last-mentioned means comprising switching means for simultaneously adjusting said inductance means and said capacitance means in said network.

20. In an oscillation generator of the thermionic vacuum tube type including a cathode and at least two additional electrodes, a frequency determining circuit connected between the cathode and one of said electrodes and comprising a variable inductance, a capacity variable in steps, and a continuously variable capacity tuning said circuit; and a second circuit connected between the cathode and another of said electrodes and including an inductance magnetically coupled to the first-mentioned inductance and including said capacity variable in steps.

21. An oscillation generator for generating a current of any frequency in a plurality of wave bands, comprising a vacuum tube having plate, grid and cathode electrodes, a grid circuit for determining the frequency to be generated, connected between grid and cathode, said circuit comprising an adjustable inductance in series with a capacity adjustable in steps, shunted by a variable condenser, a control member for operating said variable condenser, a feedback circuit between plate and cathode, having an inductance magnetically coupled to said first-mentioned inductance, and including said adjustable capacity, and switching means to simultaneously change the values of said adjustable inductance and said adjustable capacity.

22. An oscillation generator for generating a current of any frequency in a plurality of wave bands, comprising a vacuum tube having plate, grid and cathode electrodes, a grid circuit for determining the frequency to be generated, connected between the grid and cathode, said grid circuit comprising adjustable inductance in series with a capacity adjustable in steps, shunted by a variable condenser, a control member for operating said variable condenser, a feedback circuit between plate and cathode, having an inductance magnetically coupled with said first-mentioned inductance, and switching means to simultaneously change the values of said adjustable inductance and said adjustable capacity.

23. An oscillation generator of the thermionic vacuum tube type including grid and plate circuits, a frequency-determining network to tune one of said circuits, said network including a variable inductance, a first capacity adjustable in steps, and a second capacity which is variable;

feedback means between said grid and plate circuits including inductive reactance; uni-control means for simultaneously modifying said variable inductance and the value of said first capacity whereby the effective coupling between the grid and plate circuits is maintained substantially uniform throughout a broad wave band.

24. An oscillation generator comprising a vacuum tube having grid and plate circuits, a frequency-determining network for tuning one of said circuits, said network including inductance means adjustable in steps an adjustable tuning condenser and capacitance means adjustable in steps, a feed-back means between said grid and plate circuits including inductive reactance and at least a portion of said capacitance means, and uni-control means for adjusting said inductance means and for simultaneously adjusting the portion of said capacitance means included in said feedback means, whereby the effective coupling between the grid and plate circuits is maintained substantially uniform throughout the broad wave band.

25. In an oscillation generator of the thermionic vacuum tube type, a grid circuit, a frequency-determining network in said circuit comprising a variable inductance, a first capacity variable in steps and a second capacity which is continuously variable for tuning said grid circuit, a feedback circuit including an inductance electromagnetically coupled to said variable inductance, and means for simultaneously altering said variable inductance and said first capacity to effect large changes in the frequency of said oscillator.

HAROLD MILLER LEWIS.